(12) United States Patent
Mizushima et al.

(10) Patent No.: US 7,982,136 B2
(45) Date of Patent: Jul. 19, 2011

(54) WIRED CIRCUIT BOARD AND PRODUCING METHOD THEREOF

(75) Inventors: Aya Mizushima, Osaka (JP); Jun Ishii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 685 days.

(21) Appl. No.: 12/149,975

(22) Filed: May 12, 2008

(65) Prior Publication Data

US 2008/0277147 A1 Nov. 13, 2008

Related U.S. Application Data

(60) Provisional application No. 60/929,057, filed on Jun. 11, 2007.

(30) Foreign Application Priority Data

May 11, 2007 (JP) ................................. 2007-127197

(51) Int. Cl.
*H05K 1/03* (2006.01)

(52) U.S. Cl. .......................... 174/255; 174/254; 174/261

(58) Field of Classification Search .................. 174/254, 174/255, 260, 261; 361/685, 792–795; 29/846, 29/592.1, 825
See application file for complete search history.

(56) References Cited

U.S. PATENT DOCUMENTS

| | | | | |
|---|---|---|---|---|
| 6,100,582 | A * | 8/2000 | Omote et al. ................. | 257/699 |
| 6,365,959 | B2 * | 4/2002 | Yuasa et al. .................... | 257/646 |
| 6,774,489 | B2 * | 8/2004 | Russell et al. ................ | 257/752 |
| 6,801,402 | B1 * | 10/2004 | Subrahmanyam et al. .......................... | 360/245.9 |
| 2003/0089520 | A1 * | 5/2003 | Ooyabu et al. ................ | 174/255 |
| 2004/0221447 | A1 | 11/2004 | Ishii et al. | |
| 2006/0269730 | A1 | 11/2006 | Ishii et al. | |

FOREIGN PATENT DOCUMENTS

| | | |
|---|---|---|
| JP | 2004-335700 | 11/2004 |
| JP | 2006-332549 | 12/2006 |

* cited by examiner

*Primary Examiner* — Yuriy Semenenko
(74) *Attorney, Agent, or Firm* — Jean C. Edwards, Esq.; Edwards Neils PLLC

(57) ABSTRACT

A wired circuit board includes a metal supporting board, an insulating layer formed on the metal supporting board, and a conductive pattern formed on the insulating layer. The conductive pattern includes an underlying layer formed on the insulating layer and a conductive layer formed on the underlying layer. The underlying layer is formed with a corroded portion corroded from a side end portion of the conductive layer toward an inner portion thereof. A semiconductive layer is formed on a surface of the insulating layer and on a surface of the conductive pattern. The semiconductive layer is formed so as to come in contact with the metal supporting board and have a cut formed in the corroded portion to interrupt conduction between the semiconductive layer formed on the surface of the insulating layer and the semiconductive layer formed on a surface of the conductive layer.

4 Claims, 4 Drawing Sheets

WIRED CIRCUIT BOARD AND PRODUCING METHOD THEREOF

CROSS-REFERENCE TO RELATED APPLICATIONS

This patent application claims the benefit of U.S. Provisional Application No. 60/929,057, filed on Jun. 11, 2007, and claims priority from Japanese Patent Application No. 2007-127197, filed on May 11, 2007, the contents of which are herein incorporated by reference in their entirety.

BACKGROUND OF THE INVENTION

1. Field of the Invention

The present invention relates to a wired circuit board and a producing method thereof. More particularly, the present invention relates to a wired circuit board, such as a suspension board with circuit, and a producing method thereof.

2. Description of the Related Art

A wired circuit board such as a suspension board with circuit includes, e.g., a metal supporting board, an insulating base layer formed thereon, a conductive pattern formed thereon, and an insulating cover layer formed on the insulating base layer so as to cover the conductive pattern. Such a wired circuit board is widely used in the field of various electric and electronic equipment.

For example, a suspension board with circuit is proposed in which a semiconductive layer in contact with a conductive pattern and a metal supporting board is continuously interposed between an insulating base layer exposed from the conductive pattern and an insulating cover layer (see, e.g., Japanese Unexamined Patent No. 2006-332549 (FIG. 2)). In the suspension board with circuit, static electricity can be discharged from the insulating base layer and the insulating cover layer by the semiconductive layer.

SUMMARY OF THE INVENTION

Figure 4:
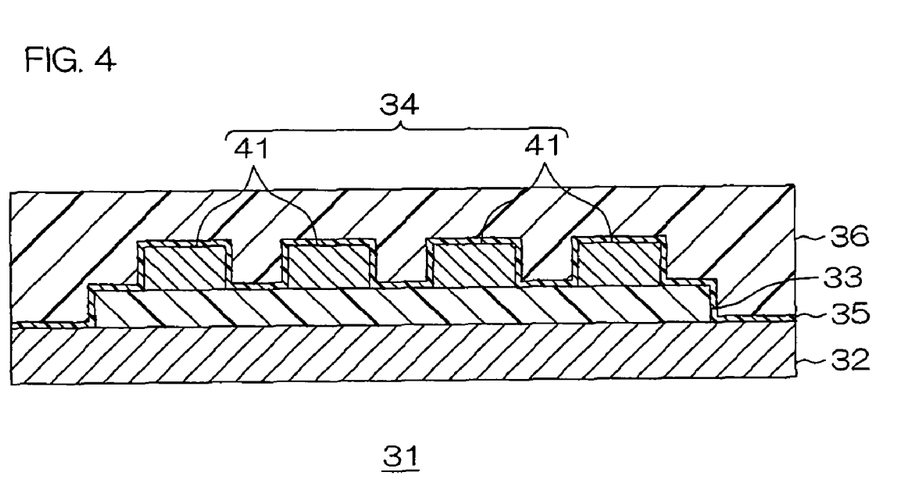
FIG. 4 is a cross-sectional view of a suspension board with circuit in a widthwise direction.

FIG. 4 is a cross-sectional view of the suspension board with circuit described in Japanese Unexamined Patent No. 2006-332549 in a widthwise direction perpendicular to a longitudinal direction of the suspension board with circuit. As shown in FIG. 4, the suspension board with circuit 31 includes a metal supporting board 32, an insulating base layer 33 formed thereon, a conductive pattern 34 formed thereon and including a plurality of wires 41, and an insulating cover layer 36 formed on the insulating base layer 33 so as to cover the conductive pattern 34. A semiconductive layer 35 is formed continuously on the surface of the metal supporting board 32, the surface of the insulating base layer 33, and the surface of the conductive pattern 34 along a widthwise direction.

However, when the suspension board with circuit 31 is used under high-temperature and high-humidity conditions, a conductor (specifically, copper) forming the conductive pattern 34 may be ionized to migrate into the semiconductive layer 35 or along the surface thereof and cause a short-circuit between the wires 41 adjacent to each other.

It is therefore an object of the present invention to provide a wired circuit board and a producing method thereof which can prevent a short-circuit between conductive patterns, while allowing discharge of static electricity from an insulating layer.

A wired circuit board of the present invention comprises a metal supporting board, an insulating layer formed on the metal supporting board, and a conductive pattern formed on the insulating layer, wherein the conductive pattern comprises an underlying layer formed on the insulating layer and a conductive layer formed on the underlying layer, the underlying layer is formed with a corroded portion corroded from a side end portion of the conductive layer toward an inner portion thereof, a semiconductive layer is formed on a surface of the insulating layer and on a surface of the conductive pattern, and the semiconductive layer is formed to come in contact with the metal supporting board and have a cut formed in the corroded portion to interrupt conduction between the semiconductive layer formed on the surface of the insulating layer and the semiconductive layer formed on a surface of the conductive layer.

In the wired circuit board of the present invention, it is preferable that a length of the corroded portion in a direction of the corrosion is not less than 2.5 μm.

In the wired circuit board of the present invention, it is preferable that the semiconductive layer is made of a metal oxide.

A method for producing a wired circuit board of the present invention comprises preparing a metal supporting board, forming an insulating layer on the metal supporting board, forming an underlying layer on the insulating layer, forming a conductive layer on the underlying layer, etching the underlying layer exposed from the conductive layer to form a conductive pattern, further etching the underlying layer to form a corroded portion in the underlying layer corroded from a side end portion of the conductive layer toward an inner portion thereof, and sputtering from above the conductive pattern in a thickness direction thereof so as to form a semiconductive layer on a surface of the insulating layer and on a surface of the conductive pattern such that the semiconductive layer comes in contact with the metal supporting board and a cut is formed in the corroded portion to interrupt conduction between the semiconductive layer formed on the surface of the insulating layer and the semiconductive layer formed on a surface of the conductive layer.

In accordance with the wired circuit board and a producing method thereof in the present invention, even when the insulating layer is charged with static electricity, the static electricity can be discharged by the semiconductive layer.

Additionally, in the semiconductive layer, the cut is formed to interrupt the conduction between the semiconductive layer formed on the surface of the insulating layer and the semiconductive layer formed on the surface of the conductive layer. Therefore, even when the conductor forming the conductive layer is ionized by the use of the wired circuit board under high-temperature and high-humidity conditions, the cut can prevent the migration of ions (ion migration) along the semiconductive layer between the conductive layers.

As a result, it is possible to prevent a short-circuit in the conductive pattern, while allowing sufficient discharge of the static electricity from the insulating layer.

Moreover, in the method for producing the wired circuit board of the present invention, the semiconductive layer can be formed in the shape mentioned above by a simple and convenient method of etching the underlying layer and sputtering the semiconductive layer.

DETAILED DESCRIPTION OF THE INVENTION

Figure 1:
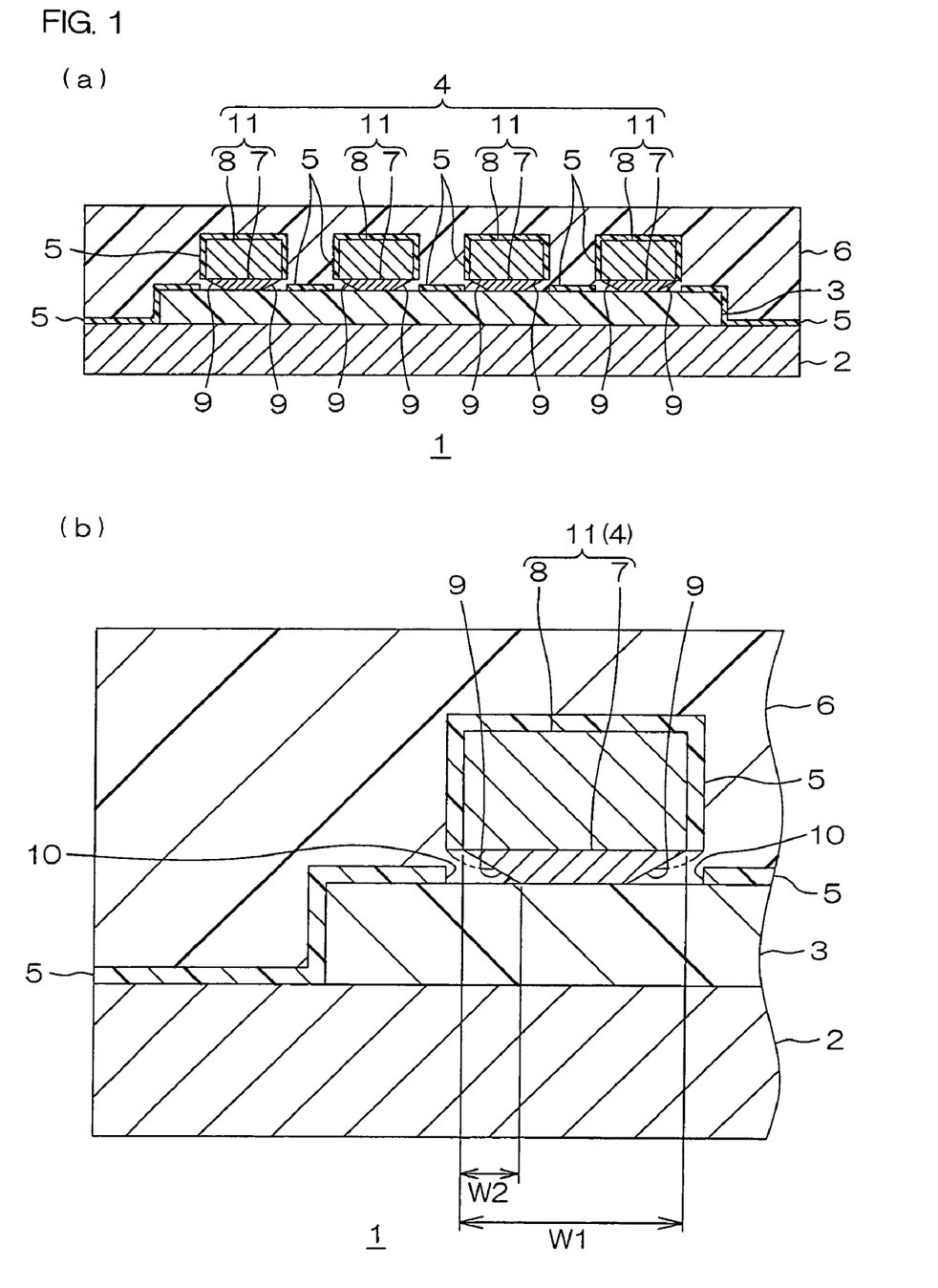
FIG. 1 is a cross-sectional view showing a principal portion of a wired circuit board according to an embodiment of the present invention, (a) showing a cross-sectional view in a widthwise direction, and (b) showing a partially enlarged view.

FIG. 1 is a cross-sectional view showing a principal portion of a wired circuit board according to an embodiment of the present invention, (a) showing a cross-sectional view in a widthwise direction perpendicular to the longitudinal direction of the wired circuit board, and (b) showing a partially enlarged view.

In FIG. 1, a wired circuit board 1 is a suspension board with circuit mounted on a hard disk drive, and includes a metal supporting board 2 extending in the longitudinal direction and an insulating base layer 3 as an insulating layer formed on the metal supporting board 2. The wired circuit board 1 also includes a conductive pattern 4 formed on the insulating base layer 3, a semiconductive layer 5 formed on the surface of the insulating base layer 3 and on the surface of the conductive pattern 4, and an insulating cover layer 6 covering the semiconductive layer 5.

The metal supporting board 2 is formed to correspond to the outer shape of the wired circuit board 1 when viewed in plan view and made of a metal foil in the shape of a flat plate or a metal thin plate.

The insulating base layer 3 is formed on the surface of the metal supporting board 2. More specifically, the insulating base layer 3 is formed on a portion corresponding to the conductive pattern 4 to extend continuously in the longitudinal direction and in the widthwise direction.

The conductive pattern 4 is formed as a wired circuit pattern including a plurality of (e.g., four) wires 11 arranged to be spaced-part from each other in the widthwise direction and provided in parallel along the longitudinal direction and terminal portions, not shown, which are provided on both end portions in the longitudinal direction of each of the wires 11.

The width W1 (see FIG. 1(b)) of the respective wire 11 (the conductive layer 8 described later) is in the range of, e.g., 10 to 1000 μm, or preferably 20 to 500 μm. The spacing between the wires 11 (conductive layers 8) is in the range of, e.g., 10 to 500 μm.

The conductive pattern 4 also includes underlying layers 7 formed on the insulating base layer 3 and conductive layers 8 formed on the underlying layers 7.

As shown in FIG. 1(b), the conductive layer 8 is formed to have a generally rectangular cross-sectional shape.

The underlying layer 7 is interposed between the insulating base layer 3 and the corresponding conductive layer 8 in a thickness direction. The underlying layer 7 is formed in the shape of a generally inverted trapezoide which is downwardly tapered when viewed in cross section. In the both widthwise end portions of the underlying layer 7, side etched portions 9 are formed as "corroded" portions formed by "corrosion" from the both widthwise end portions of the conductive layer 8 toward widthwise inner portions thereof.

The respective side etched portions 9 are formed to have upper end edges adjoining the side end edges of the corresponding conductive layer 8, and inclined downwardly and inwardly in the widthwise direction therefrom, and lower end edges adjoining the insulating base layer 3 and located inwardly of the side end edges of the conductive layer 8 in the widthwise direction. The side-etched portions 9 are formed by side-etching the underlying layers 7, as described later (see FIG. 2(d') and FIG. 3(e)).

The width (length in the direction of the corrosion) W2 of the side-etched portion 9, more specifically the widthwise length W2 between the widthwise outer end edge and inner end edge of the side-etched portion 9 is, e.g., not less than 2.5 μm, or preferably not less than 2.8 μm, and normally, e.g., not more than 10 μm, or preferably not more than 5.0 μm.

The width W2 of the side-etched portion 9 is appropriately selected in accordance with the width W1 of the wire 11. When the width W1 of the wire 11 is not less than 10 μm and less than 30 μm, the width W2 of the side-etched portion 9 is in the range of, e.g., 2.5 to 5 μm, or preferably 2.5 to 3.5 μm. When the width W1 of the wire 11 is not less than 30 μm and less than 50 μm, the width W2 of the side-etched portion 9 is in the range of, e.g., 2.5 to 10 μm, or preferably 2.5 to 5 μm. When the width W1 of the wire 11 is not less than 50 μm and less than 100 μm, the width W2 of the side-etched portion 9 is in the range of, e.g., 2.5 to 20 μm, or preferably 2.5 to 10 μm. When the width W1 of the wire 11 is not less than 100 μm, the width W2 of the side-etched portion 9 is in the range of, e.g., 2.5 to 50 μm, or preferably 2.5 to 10 μm.

When the width W2 of the side-etched portion 9 is less than the range shown above, there may be a case where cuts 10 described later cannot be surely formed in the semiconductive layer 5 or, even though the cuts 10 can be formed, ion migration along the semiconductive layer 5 cannot be effectively prevented. On the other hand, when the width W2 of the side-etched portion 9 is more than the range shown above, there may be a case where the wire 11 collapses to be peeled from the insulating base layer 3.

The semiconductive layer 5 is formed on the surface of the conductive pattern 4, on the surface of the insulating base layer 3 exposed from the conductive pattern 4, and on the surface of the metal supporting board 2 exposed from the insulating base layer 3 so as to extend in the longitudinal direction. More specifically, the semiconductive layer 5 is formed on the upper surfaces and both widthwise side surfaces of the conductive layers 8, on the upper surface and both widthwise side surfaces of the insulating base layer 3 exposed from the conductive pattern 4, and on the upper surface of the metal supporting board 2 exposed from the insulating base layer 3 so as to extend in the longitudinal direction.

On the other hand, the semiconductive layer 5 is formed not to be continuous between the individual wires 11. That is, the semiconductive layer 5 is not formed on the both widthwise side surfaces of the underlying layers 7, i.e., in the side-etched portions 9 between the individual wires 11. The resulting discontinuous portions are formed as the cuts 10 in the semiconductive layer 5.

The cuts 10 are formed to correspond to the side-etched portions 9 and extend along each of the wires 11. As a result, the conduction of the semiconductive layer 5 between the individual wires 11, more specifically the conduction between the semiconductive layer 5 formed on the surface of the insulating base layer 3 and the semiconductive layer 5 formed on the surfaces of the conductive layers 8 is interrupted.

The insulating cover layer 6 is formed on the insulating base layer 3 to cover the semiconductive layer 5. That is, the insulating cover layer 6 is formed on the surface of the semiconductive layer 5 to be continuous in the longitudinal direction and in the widthwise direction.

The insulating cover layer 6 is filled in the side-etched portions 9. More specifically, the insulating cover layer 6 is formed on the surface of the insulating base layer 3 exposed from the cuts 10 and on the both widthwise side surfaces of the underlying layers 7 exposed from the cuts 10 inside the side-etched portions 9.

Figure 2:
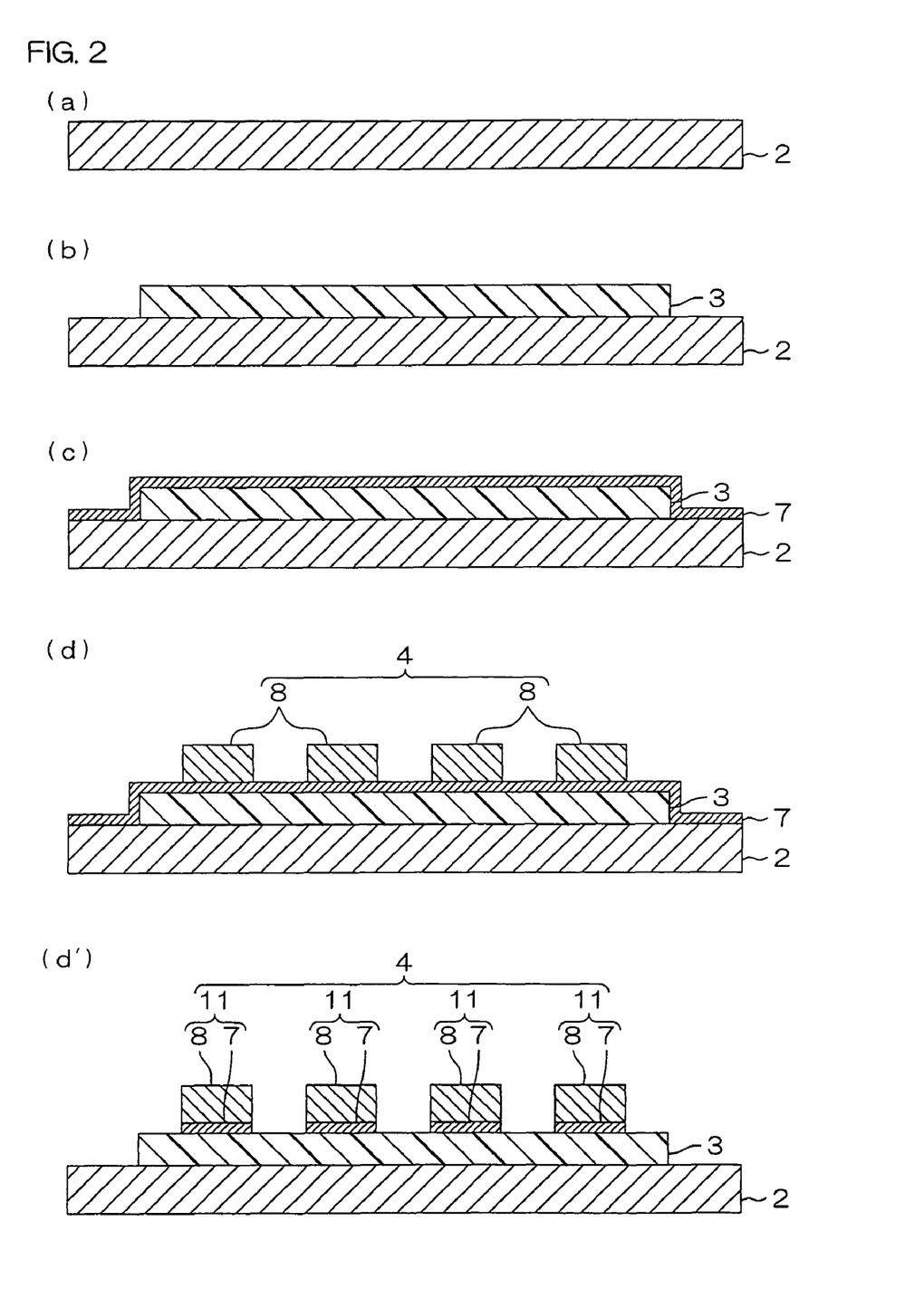
FIG. 2 is a production process view showing a method for producing the wired circuit board shown in FIG. 1, which corresponds to FIG. 1(a), (a) showing the step of preparing a metal supporting board, (b) showing the step of forming an insulating base layer on the metal supporting board, (c) showing the step of forming an underlying layer on the entire surface of the insulating base layer including the metal supporting board, (d) showing the step of forming conductive layers on the underlying layer, and (d') showing the step of etching the underlying layer exposed from the conductive layers.
Figure 3:
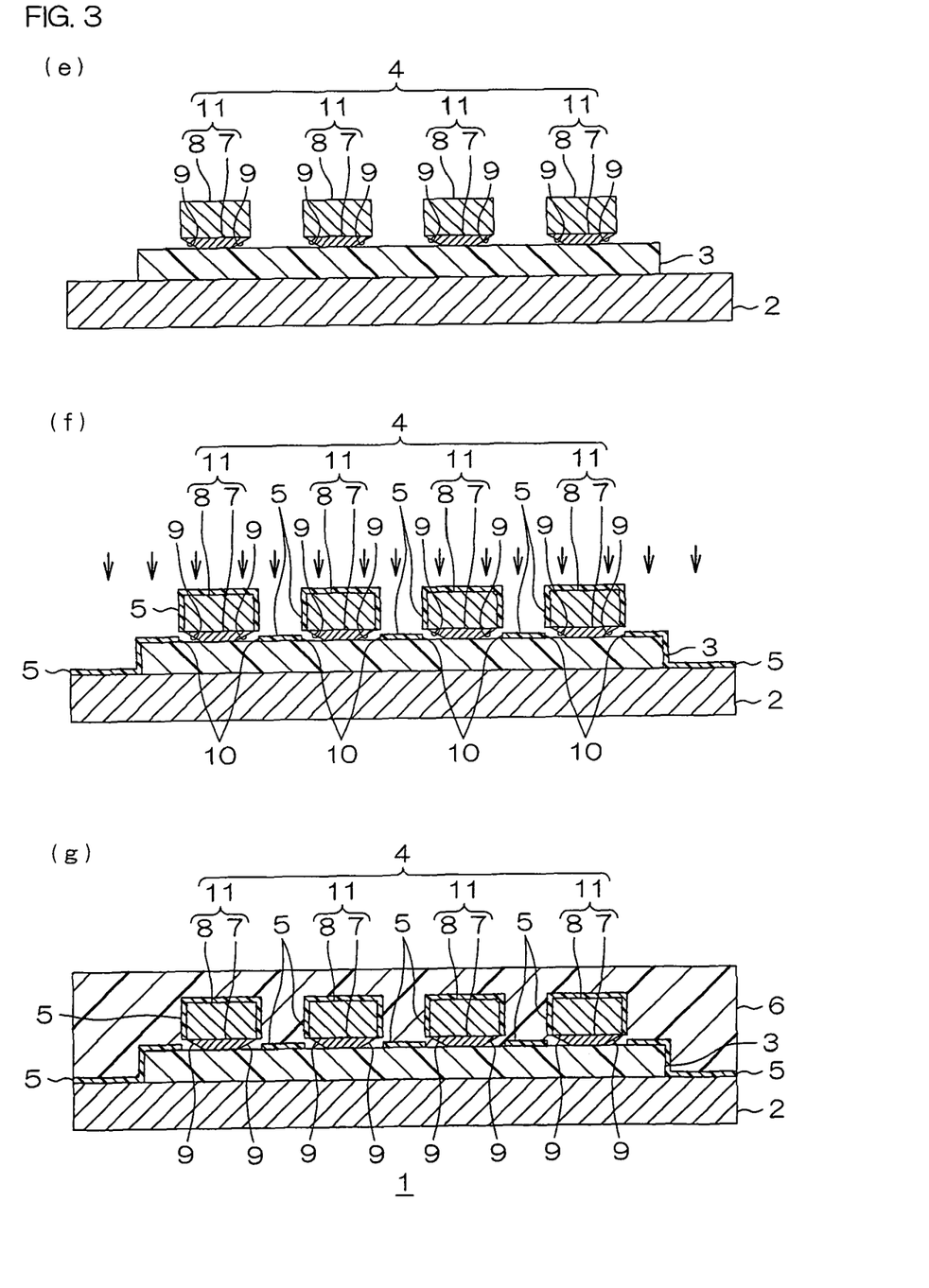
FIG. 3 is a production process view showing, subsequently to FIG. 2, the method for producing the wired circuit board shown in FIG. 1, which corresponds to FIG. 1(a), (e) showing the step of side-etching the underlying layers under the conductive layers, (f) showing the step of forming a semiconductive layer on the respective surfaces of the metal supporting board, the insulating base layer, and the conductive pattern so as to form cuts in the semiconductive layer, and (g) showing the step of forming an insulating cover layer on the surface of the semiconductive layer.

FIGS. 2 and 3 are production process views showing a method for producing the wired circuit board shown in FIG. 1, which correspond to FIG. 1(a).

Next, a description is given to the method for producing the wired circuit board 1 with reference to FIGS. 2 and 3.

First, as shown in FIG. 2(a), the metal supporting board 2 is prepared in the method.

For the metal supporting board 2, a metal foil of, e.g., stainless steel, a 42-alloy, aluminum, a copper-beryllium alloy, phosphor bronze, or the like is used. Preferably, a stainless steel foil is used. The thickness of the metal supporting board 2 is in the range of, e.g., 10 to 50 μm, or preferably 15 to 30 μm.

Then, as shown in FIG. 2(b), the insulating base layer 3 is formed in the foregoing pattern on the metal supporting board 2.

The insulating base layer 3 is made of a resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. In terms of heat resistance, the insulating base layer 3 is preferably made of a polyimide resin.

To form the insulating base layer 3 in the foregoing pattern, e.g., a varnish of a photosensitive resin (photosensitive polyamic acid resin) is coated on a surface of the metal supporting board 2 and the coated varnish is dried to form a base coating. Then, the base coating is exposed to light via a photomask, heated as necessary, and developed to form the pattern. Thereafter, the pattern is cured (imidized) by, e.g., heating at a temperature of not less than 250° C. under a reduced pressure.

The thickness of the insulating base layer 3 thus formed is in the range of, e.g., 1 to 35 μm, or preferably 8 to 15 μm.

Next, as shown in FIGS. 2(c) and 2(d), the underlying layer 7 and the conductive layers 8 are formed on the insulating base layer 3.

Examples of a metal used to form the underlying layer 7 include copper and chromium. As a conductive material used to form the conductive layers 8, a metal is used such as, e.g., copper, nickel, gold, a solder, or an alloy thereof. Preferably, copper is used.

To form the underlying layer 7 and the conductive layers 8, the underlying layer 7 is formed first on the entire surface of the insulating base layer 3 including the metal supporting board 2, as shown in FIG. 2(c). In the formation of the underlying layer 7, e.g., sputtering, plating, or the like is used. Preferably, sputtering is used. In sputtering, a chromium thin film and a copper thin film are successively laminated by chromium sputtering and copper sputtering.

The thickness of the underlying layer 7 thus formed is in the range of, e.g., 20 to 500 nm, or preferably 50 to 300 nm. More specifically, the thickness of the chromium thin film is in the range of 10 to 100 nm and the thickness of the copper thin film is in the range of 10 to 200 nm.

Then, as shown in FIG. 2(d), the conductive layers 8 are formed in the foregoing wired circuit pattern on the underlying layer 7.

The conductive layers 8 are formed by a known patterning method such as, e.g., a subtractive method or an additive method. Preferably, the conductive layers 8 are formed by the additive method.

In the additive method, a plating resist not shown is formed first in a pattern reverse to the wired circuit pattern on the surface of the underlying layer 7, and then the conductive pattern 4 is formed in the wired circuit pattern on the upper surface of the underlying layer 7 exposed from the plating resist by electrolytic plating. Thereafter, the plating resist is removed by etching, stripping, or the like.

The thickness of the conductive layer 8 thus formed is in the range of, e.g., 3 to 20 μm, or preferably 5 to 20 μm.

Then, as shown in FIG. 2(d') and FIG. 3(e), the underlying layer 7 exposed from the conductive layers 8 is etched to form the conductive pattern 4. Subsequently, the underlying layers 7 under the conductive layers 8 are further etched (side-etched) so that the side-etched portions 9 are formed in the underlying layers 7.

In the etching of the underlying layer 7 exposed from the conductive layers 8 and the side-etching of the underlying layers 7 under the conductive layers 8, dry etching such as, e.g., plasma etching, wet etching such as, e.g., chemical etching, or the like is used. Preferably, wet etching is used.

In the wet etching, e.g., the wired circuit board 1 on which the conductive layers 8 are formed is dipped in an etching solution. The etching solution is appropriately selected in accordance with the type of metal for forming the underlying layer 7. When the metal of the underlying layer 7 is, e.g., copper and chromium, a solution mixture of an aqueous hydrogen peroxide and a nitric acid or the like is used. In the wet etching, the temperature of the etching solution is set to the range of, e.g., 30 to 38° C. and a time of dipping in the etching solution is set to the range of, e.g., 0.5 to 5 minutes, or preferably 1 to 2 minutes.

By the etching, the underlying layer 7 exposed from the conductive layers 8 is first removed, as shown in FIG. 2(d'). Subsequently, as shown in FIG. 3(e), the both widthwise end portions of the underlying layers 7 under the conductive layers 8 are removed by side etching to form the side-etched portions 9. Simultaneously with the etching of the underlying layer 7, the surfaces of the conductive layers 8 are etched; however, since the conductive layers 8 are formed sufficiently thick compared with the underlying layer 7, a change in the thickness of the conductive layer 8 can be ignored.

Then, as shown in FIG. 3(f), the semiconductive layer 5 is formed on the surfaces of the conductive layers 8, on the surface of the insulating base layer 3 exposed from the conductive pattern 4, and on the surface of the metal supporting board 2 exposed from the insulating base layer 3.

As a semiconductive material for forming the semiconductive layer 5, a metal or a conductive resin is used. Preferably, a metal is used.

As an example of the metal, a metal oxide or the like is used. When a metal oxide is used for the semiconductive layer 5, the semiconductive layer 5 can be formed to have a uniform thickness. Examples of the metal oxide include chromium oxide, nickel oxide, copper oxide, titanium oxide, zirconium oxide, indium oxide, aluminum oxide, and zinc oxide. Preferably, chromium oxide is used.

To form the semiconductive layer 5 made of a metal oxide, there is used, e.g., a method which sputters a metal as a target and then oxidizes the metal by heating as necessary, a method which performs reactive sputtering, a method which sputters a metal oxide as a target, or the like.

In the method of sputtering a metal as a target and then oxidizing the metal by heating as necessary, a metal such as, e.g., chromium is used as the target and the wired circuit board 1 on which the conductive pattern 4 is formed is placed in a sputtering apparatus such that the conductive pattern 4 faces the target. Then, sputtering is performed, while introducing an inert gas such as argon. Thereafter, the metal is oxidized in an atmosphere by heating at a temperature of 50 to 400° C. for 1 minute to 12 hours using a heating furnace or the like as necessary to form the semiconductive layer 5 made of a metal oxide.

In the method of performing reactive sputtering, a metal such as, e.g., chromium is used as the target and the wired circuit board 1 on which the conductive pattern 4 is formed is placed in a sputtering apparatus such that the conductive pattern 4 faces the target. Then, sputtering is performed, while introducing a reactive gas containing oxygen, to form the semiconductive layer 5 made of a metal oxide.

In the method of sputtering a metal oxide as a target, a metal oxide such as, e.g., chromium oxide is used as the target and the wired circuit board 1 on which the conductive pattern 4 is formed is placed in a sputtering apparatus such that the conductive pattern 4 faces the target. Then, sputtering is performed, while introducing an inert gas such as argon, to form the semiconductive layer 5 made of a metal oxide.

The semiconductive layer 5 made of such a metal oxide can be formed in accordance with the description of Japanese Unexamined Patent No. 2004-335700.

In the sputtering, the metal or the metal oxide as the target is scattered to fall downwardly in the thickness direction of the conductive pattern 4 toward the surfaces of the conductive layers 8, the surface of the insulating base layer 3 exposed from the conductive pattern 4, and the surface of the metal supporting board 2 exposed from the insulating base layer 3, as indicated by the arrows of FIG. 3(f), and finally adheres thereto. Accordingly, the metal or the metal oxide does not adhere to the side-etched portions 9, and the semiconductive layer 5 is formed such that the cuts 10 are formed in the side-etched portions 9.

The thickness of the semiconductive layer 5 thus formed is in the range of, e.g., 5 to 50 nm, or preferably 10 to 20 nm.

Then, as shown in FIG. 3(g), the insulating cover layer 6 is formed in a pattern covering the semiconductive player 5.

The insulating cover layer 6 is made of the same resin as that of the insulating base layer 3. Preferably, the insulating cover layer 6 is made of a polyimide resin.

To form the insulating cover layer 6 in the foregoing pattern, e.g., a varnish of a photosensitive resin (photosensitive polyamic acid resin) is coated on the surface of the semiconductive layer 5 (including the insulating base layer 3 exposed from the cuts 10), and the coated varnish is dried to form a cover coating. Then, the cover coating is exposed to light via a photomask, heated as necessary, and developed to form the pattern. Thereafter, the pattern is cured (imidized) by, e.g., heating at a temperature of not less than 250° C. under a reduced pressure.

The thickness of the insulating cover layer 6 thus formed is in the range of, e.g., 1 to 40 μm, or preferably 3 to 5 μm.

Then, the semiconductive layer 5 formed on the upper surfaces of the terminal portions of the conductive pattern 4 is removed by etching or the like, though not shown. Thereafter, the metal supporting board 2 is trimmed into a desired shape, whereby the wired circuit board 1 is obtained.

In the wired circuit board 1 thus formed, the electric resistance between the metal supporting board and the conductive pattern is set to a value of, e.g., not less than $1 \times 10^8 \Omega$, or preferably not less than $1 \times 10^9 \Omega$, and normally not more than $1 \times 10^{13} \Omega$. As the value of the electric resistance between the metal supporting board and the conductive pattern is lower, it shows that a short-circuit is more likely to occur between the conductive patterns.

In the wired circuit board 1 thus obtained, even when the insulating base layer 3 and the insulating cover layer 6 are charged with static electricity, the static electricity can be discharged by the semiconductive layer 5.

Additionally, in the semiconductive layer 5, the cuts 10 are formed to interrupt the conduction between the semiconductive layer 5 formed on the surface of the insulating base layer 3 and the semiconductive layer 5 formed on the surface of the conductive pattern 4. As a result, even when the conductor forming the conductive layers 8 and the metal forming the underlying layers 7 are ionized by the use of the wired circuit board 1 under high-temperature and high-humidity conditions, the cuts 10 can prevent migration of these ions (ion migration) along the semiconductive layer 5 between the individual wires 11.

Therefore, it is possible to prevent a short-circuit between the individual wires 11, while allowing sufficient discharge of the static electricity from the insulating base layer 3 and the insulating cover layer 6.

Moreover, the method for producing the wired circuit board 1 allows the formation of the semiconductive layer 5 in the foregoing shape by a simple and convenient method of etching the underlying layer 7 (FIG. 2(d)), side-etching the underlying layers 7 (see FIG. 3(e)), and sputtering the semiconductive layer 5 (see FIG. 3(f)).

In the wired circuit board 1, the side-etched portions 9 are also formed in the peripheral end portions of the underlying layers 7 in the terminal portions by corrosion from the peripheral end portions of the conductive layers 8 in the terminal portions toward inner portions thereof in the same manner as with each of the wires 11, though not shown. As a result, the cuts 10 are formed in the semiconductive layer 5 in the terminal portions. Therefore, it is possible to prevent the ion migration of the conductor of the conductive layers 8 and the metal of the underlying layers 7 in the terminal portions between the individual terminal portions even in the use of the wired circuit board 1 under high-temperature and high-humidity conditions.

In the description given above, no semiconductive layer 5 is formed in the side-etched portions 9, as indicated by the solid lines of FIG. 1(b). However, the semiconductive layer serves its purpose as long as the cuts 10 are formed therein. A semiconductive layer 5 is also acceptable that is partially formed in the side-etched portions 9, as indicated by the imaginary lines of FIG. 1(b).

In the description given above, the wired circuit board of the present invention is described using the suspension board with circuit including the metal supporting board 2 as an example. However, the wired circuit board of the present invention is not limited thereto, and is also widely applicable to another wired circuit board such as, e.g., a flexible wired circuit board including the metal supporting board 2 as a reinforcing layer.

EXAMPLES

The present invention is described more specifically by showing the examples and the comparative example hereinbelow. However, the present invention is by no means limited to the examples and the comparative example.

Example 1

A metal supporting board made of stainless steel having a thickness of 25 μm was prepared (see FIG. 2(a)). Then, a varnish of a photosensitive polyamic acid resin was coated on an entire surface of the metal supporting board, dried, exposed to light, developed, and then further cured by heating to form an insulating base layer made of polyimide having a thickness of 10 μm in the foregoing pattern (see FIG. 2(b)).

Next, an underlying layer was formed on the entire surface of the insulating base layer including the metal supporting board (see FIG. 2(c)). As the underlying layer, a chromium thin film having a thickness of 30 nm and a copper thin film having a thickness of 70 nm were formed in this order by chromium sputtering and copper sputtering.

Next, conductive layers were formed in the foregoing wired circuit pattern on the underlying layer by an additive method (see FIG. 3(d)).

In the additive method, a plating resist made of a dry film resist was provided on the surface of the underlying layer, exposed to light, and developed to be formed in a pattern reverse to the wired circuit pattern. Then, the conductive layer having a thickness of 10 μm was formed by electrolytic copper plating on the surface of the underlying layer exposed from the plating resist. The width of the wire was 30 μm and the spacing between the individual wires was 30 μm.

Next, the underlying layer exposed from the conductive layers was etched (see FIG. 2(d)). Subsequently, the underlying layers were side-etched so that the side-etched portions were formed in the underlying layers (see FIG. 3(e)).

In the etching of the underlying layer exposed from the conductive layers and the side-etching of the underlying layers under the conductive layers, the wired circuit board in a process of the production was dipped in an aqueous solution mixture of an aqueous hydrogen peroxide and a nitric acid (in which the aqueous hydrogen peroxide concentration was 35 wt % and the nitric acid concentration was 20 wt %) at 35° C. for 1 minute. The width of the side-etched portion was 3.0 μm, which was measured by sectional observation.

Next, a semiconductive layer made of chromium oxide was formed on the surfaces of the conductive layers, on the surface of the insulating base layer exposed from the conductive pattern, and on the surface of the metal supporting board exposed from the insulating base layer so as to extend in the longitudinal direction (see FIG. 3(f)). The semiconductive layer made of chromium oxide was formed by sputtering chromium as a target in a sputtering apparatus in which the conductive pattern was placed to face the target to form a sputtering coating made of a chromium thin film and then oxidizing the sputtering coating by heating.

The sputtering was performed under the following conditions by a method in accordance with the description of Japanese Unexamined Patent No. 2004-335700.

Target: Cr
Ultimate Degree of Vacuum: $1.33 \times 10^{-3}$ Pa
Flow Rate of Introduced Gas (Argon): $2.0 \times 10^{-3}$ m$^3$/hour
Operating Pressure: 0.16 Pa
Temperature of Earth Electrode: 20° C.
Electric Power: DC 180 W
Sputtering Time: 5 Seconds
Thickness of Sputtering Coating: 7 nm In the oxidation by heating, the sputtering coating was heated in an atmosphere at 125° C. for 12 hours. In the semiconductive layer, cuts were formed in the side-etched portions. The thickness of the semiconductive layer was 7 nm.

Then, a varnish of a photosensitive polyamic acid resin was coated on the surface of the semiconductive layer, dried, exposed to light, developed, and then further cured by heating to form an insulating cover layer made of polyimide having a thickness of 5 μm in the foregoing pattern (see FIG. 3(g)). The insulating cover layer mentioned above was formed to have openings in the portions corresponding to the terminal portions.

Then, the semiconductive layer formed on the upper surfaces of the terminal portions was removed by etching. Thereafter, the metal supporting board was trimmed, whereby a suspension board with circuit was obtained.

Example 2

A suspension board with circuit was obtained in the same manner as in EXAMPLE 1 except that the dipping time in the etching of the underlying layer exposed from the conductive layers and the side-etching of the underlying layers under the conductive layers was changed to 1.5 minutes. The width of the side-etched portion was 3.3 μm.

Example 3

A suspension board with circuit was obtained in the same manner as in EXAMPLE 1 except that the dipping time in the etching of the underlying layer exposed from the conductive layers and the side-etching of the underlying layers under the conductive layers was changed to 2 minutes. The width of the side-etched portion was 3.5 μm.

Example 4

A suspension board with circuit was obtained in the same manner as in EXAMPLE 1 except that the dipping time in the etching of the underlying layer exposed from the conductive layers and the side-etching of the underlying layers under the conductive layers was changed to 0.5 minutes. The width of the side-etched portion was 2.0 μm.

Comparative Example 1

A suspension board with circuit was obtained in the same manner as in EXAMPLE 1 except that the dipping time in the etching of the underlying layer exposed from the conductive layers was changed to 0.3 minutes (see FIG. 4). In the etching mentioned above, no side-etched portion was formed in the underlying layers (see FIG. 2($d'$)). In addition, the semiconductive layer was formed continuously in the widthwise direction, and no cut was formed therein.

Evaluation (1) Electric Resistance between Metal Supporting Board and Conductive Pattern In each of the suspension boards with circuit obtained in the examples and the comparative example, the electric resistance between the metal supporting board and the conductive pattern was measured using a resistance measuring device (Hiresta-UP MCP-HT450 available from Mitsubishi Chemical Corporation), the result of which is shown in Table 1.

(2) Time Before Short-Circuit Between Conductive Patterns

In each of the suspension boards with circuit obtained in the examples and the comparative example, a voltage of 6 V was applied between wires adjacent to each other. The suspension board with circuit was allowed to stand in that condition in an atmosphere at 85° C. and 85% RH, and a time elapsed before a short-circuit occurred between the conductive patterns was measured, the result of which is shown in Table 1.

TABLE 1

| Suspension Board with Circuit | | Example 1 | Example 2 | Example 3 | Example 4 | Comparative Example 1 |
|---|---|---|---|---|---|---|
| Size | Width of Side-Etched Portion (μm) | 3.0 | 3.3 | 3.5 | 2.0 | — |
| Evaluation | Electric Resistance (Ω) Between Metal Supporting Board and Conductive Pattern | $1 \times 10^9$ | $1 \times 10^{10}$ | $1 \times 10^{11}$ | $1 \times 10^7$ | $5 \times 10^6$ |
| | Time before Short-Circuit (Hours) Between Conductive Patterns | 400 | 600 | 1000 | 200 | 50 |

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
   a metal supporting board;
   an insulating layer formed on the metal supporting board; and
   a conductive pattern formed on the insulating layer, wherein
   the conductive pattern comprises an underlying layer formed on the insulating layer and a conductive layer formed on the underlying layer,
   the underlying layer is formed with a corroded portion corroded from a side end portion of the conductive layer toward an inner portion thereof,
   a semiconductive layer is formed on a surface of the insulating layer and on a surface of the conductive pattern, and
   the semiconductive layer is formed to come in contact with the metal supporting board and have a cut formed in the corroded portion to interrupt conduction between the semiconductive layer formed on the surface of the insulating layer and the semiconductive layer formed on a surface of the conductive layer.

2. The wired circuit board according to claim 1, wherein a length of the corroded portion in a direction of the corrosion is not less than 2.5 μm.

3. The wired circuit board according to claim 1, wherein the semiconductive layer is made of a metal oxide.

4. A method for producing a wired circuit board, the method comprising:
- preparing a metal supporting board;
- forming an insulating layer on the metal supporting board;
- forming an underlying layer on the insulating layer;
- forming a conductive layer on the underlying layer;
- etching the underlying layer exposed from the conductive layer to form a conductive pattern;
- further etching the underlying layer to form a corroded portion in the underlying layer corroded from a side end portion of the conductive layer toward an inner portion thereof; and
- sputtering from above the conductive pattern in a thickness direction thereof so as to form a semiconductive layer on a surface of the insulating layer and on a surface of the conductive pattern such that the semiconductive layer comes in contact with the metal supporting board and a cut is formed in the corroded portion to interrupt conduction between the semiconductive layer formed on the surface of the insulating layer and the semiconductive layer formed on a surface of the conductive layer.

* * * * *